(12) United States Patent
Poghosyan et al.

(10) Patent No.: US 11,657,980 B1
(45) Date of Patent: May 23, 2023

(54) DIELECTRIC FLUID VARIABLE CAPACITOR

(71) Applicant: COMET TECHNOLOGIES USA, INC., San Jose, CA (US)

(72) Inventors: Tigran Poghosyan, San Jose, CA (US); Anthony Oliveti, San Jose, CA (US); Gabe Calebotta, San Jose, CA (US); J. Kirkwood Rough, San Jose, CA (US)

(73) Assignee: COMET TECHNOLOGIES USA, INC., San Jose, CA (US)

( * ) Notice: Subject to any disclaimer, the term of this patent is extended or adjusted under 35 U.S.C. 154(b) by 0 days.

(21) Appl. No.: 17/739,595

(22) Filed: May 9, 2022

(51) Int. Cl.
| | |
|---|---|
| *H01G 5/16* | (2006.01) |
| *H01G 5/011* | (2006.01) |
| *H01G 5/013* | (2006.01) |
| *H01G 5/014* | (2006.01) |
| *H01J 37/32* | (2006.01) |

(52) U.S. Cl.
CPC .............. *H01G 5/16* (2013.01); *H01G 5/011* (2013.01); *H01G 5/014* (2013.01); *H01G 5/0132* (2013.01); *H01J 37/32091* (2013.01); *H01J 37/32183* (2013.01); *H01J 2237/327* (2013.01)

(58) Field of Classification Search
CPC .. H01G 5/38; H01G 5/14; H01G 5/10; H01G 5/16
See application file for complete search history.

(56) References Cited

U.S. PATENT DOCUMENTS

| | | | |
|---|---|---|---|
| 4,177,495 A | * | 12/1979 | Perret .................... H01G 5/14 361/278 |
| 4,679,007 A | | 7/1987 | Reese et al. |
| 5,175,472 A | | 12/1992 | Johnson, Jr. et al. |
| 5,195,045 A | | 3/1993 | Keane et al. |

(Continued)

FOREIGN PATENT DOCUMENTS

| | | |
|---|---|---|
| JP | 04239211 A | 8/1992 |
| JP | 05284046 A | 8/1993 |

(Continued)

OTHER PUBLICATIONS

PCT/US2018/062951—International Search Report and Written Opinion of International Searching Authority, dated Aug. 28, 2019, 10 pages.

(Continued)

*Primary Examiner* — Eric W Thomas
(74) *Attorney, Agent, or Firm* — Nolte Lackenbach Siegel

(57) ABSTRACT

A variable capacitor includes an enclosure having first and second conductive collars separated by an intermediate electrically insulating element. A movable capacitor plate assembly is electrically coupled to the first conductive collar, and a fixed capacitor plate assembly is electrically coupled to the second conductive collar. An actuator extends into the enclosure for advancing and retracting the movable capacitor plate assembly relative to the fixed capacitor plate assembly. A hermetically sealed volume within the enclosure contains a dielectric fluid serving as a dielectric between a capacitor plate of the movable capacitor plate assembly and a capacitor plate of the fixed capacitor plate assembly. A flexible structure is provided to contain the dielectric fluid displaced when the movable capacitor plate assembly is advanced toward the fixed capacitor plate assembly.

16 Claims, 7 Drawing Sheets

(56) References Cited

U.S. PATENT DOCUMENTS

| | | | |
|---|---|---|---|
| 5,394,061 A | 2/1995 | Fujii | |
| 5,474,648 A | 12/1995 | Patrick et al. | |
| 5,576,629 A | 11/1996 | Turner et al. | |
| 5,609,737 A | 3/1997 | Fukui et al. | |
| 5,629,653 A | 5/1997 | Stimson | |
| 5,737,175 A | 4/1998 | Grosshart et al. | |
| 5,792,261 A | 8/1998 | Hama et al. | |
| 5,810,963 A | 9/1998 | Tomioka | |
| 5,842,154 A | 11/1998 | Harnett et al. | |
| 5,849,136 A | 12/1998 | Mintz et al. | |
| 5,866,869 A | 2/1999 | Schneider | |
| 5,889,252 A | 3/1999 | Williams et al. | |
| 5,910,886 A | 6/1999 | Coleman | |
| 5,914,974 A | 6/1999 | Partlo | |
| 6,016,131 A | 1/2000 | Sato et al. | |
| 6,157,179 A | 12/2000 | Miermans | |
| 6,164,241 A | 12/2000 | Chen et al. | |
| 6,252,354 B1 | 6/2001 | Collins et al. | |
| 6,268,995 B1 * | 7/2001 | Beuerman | H01G 5/00 361/278 |
| 6,313,584 B1 | 11/2001 | Johnson et al. | |
| 6,313,587 B1 | 11/2001 | MacLennan et al. | |
| 6,326,597 B1 | 12/2001 | Lubomirsky et al. | |
| 6,407,648 B1 | 6/2002 | Johnson | |
| 6,455,437 B1 | 9/2002 | Davidow et al. | |
| 6,463,875 B1 | 10/2002 | Chen et al. | |
| 6,507,155 B1 | 1/2003 | Barnes et al. | |
| 6,677,828 B1 | 1/2004 | Harnett et al. | |
| 6,703,080 B2 | 3/2004 | Reyzelman | |
| 6,806,437 B2 | 10/2004 | Oh | |
| 6,876,155 B2 | 4/2005 | Howald et al. | |
| 6,894,245 B2 | 5/2005 | Hoffman | |
| 6,949,887 B2 | 9/2005 | Kirkpatrick et al. | |
| 7,030,335 B2 | 4/2006 | Hoffman | |
| 7,042,311 B1 | 5/2006 | Hilliker et al. | |
| 7,079,597 B1 | 7/2006 | Kenwood | |
| 7,102,292 B2 | 9/2006 | Parsons et al. | |
| 7,192,505 B2 | 3/2007 | Roche et al. | |
| 7,196,283 B2 | 3/2007 | Buchberger, Jr. | |
| 7,215,697 B2 | 5/2007 | Hill et al. | |
| 7,220,937 B2 | 5/2007 | Hoffman | |
| 7,251,121 B2 | 7/2007 | Bhutta | |
| 7,259,623 B2 | 8/2007 | Coleman | |
| 7,298,128 B2 | 11/2007 | Bhutta | |
| 7,467,612 B2 | 12/2008 | Suckewer | |
| 7,514,936 B2 | 4/2009 | Anwar | |
| 7,795,877 B2 | 9/2010 | Radtke | |
| 7,796,368 B2 | 9/2010 | Kotani | |
| 8,169,162 B2 | 5/2012 | Yuzurihara | |
| 8,203,372 B2 | 6/2012 | Arduini | |
| 8,222,822 B2 | 7/2012 | Gilbert | |
| 8,421,377 B2 | 4/2013 | Kirchmeier | |
| 8,466,622 B2 | 6/2013 | Knaus | |
| 8,471,746 B2 | 6/2013 | Kurunezi et al. | |
| 8,491,759 B2 | 7/2013 | Pipitone et al. | |
| 8,742,669 B2 | 6/2014 | Carter et al. | |
| 8,779,662 B2 | 7/2014 | Boston | |
| 8,803,424 B2 | 8/2014 | Boston | |
| 8,884,180 B2 | 11/2014 | Ilie | |
| 8,896,391 B2 | 11/2014 | du Toit | |
| 8,928,229 B2 | 1/2015 | Boston | |
| 9,042,121 B2 | 5/2015 | Walde et al. | |
| 9,065,426 B2 | 6/2015 | Mason et al. | |
| 9,105,447 B2 | 8/2015 | Brouk et al. | |
| 9,111,725 B2 | 8/2015 | Boston | |
| 9,124,248 B2 | 9/2015 | Van Zyl et al. | |
| 9,142,388 B2 | 9/2015 | Hoffman et al. | |
| 9,148,086 B2 | 9/2015 | Fife et al. | |
| 9,166,481 B1 | 10/2015 | Vinciarelli | |
| 9,171,700 B2 | 10/2015 | Gilmore | |
| 9,196,459 B2 | 11/2015 | Bhutta | |
| 9,208,992 B2 | 12/2015 | Brouk et al. | |
| 9,224,579 B2 | 12/2015 | Finley et al. | |
| 9,225,299 B2 | 12/2015 | Mueller et al. | |
| 9,287,098 B2 | 3/2016 | Finley et al. | |
| 9,294,100 B2 | 3/2016 | Van Zyl et al. | |
| 9,306,533 B1 | 4/2016 | Mavretic | |
| 9,313,870 B2 | 4/2016 | Walde et al. | |
| 9,337,804 B2 | 5/2016 | Mason et al. | |
| 9,345,122 B2 | 5/2016 | Bhutta | |
| 9,385,021 B2 | 7/2016 | Chen | |
| 9,418,822 B2 | 8/2016 | Kaneko | |
| 9,478,397 B2 | 10/2016 | Blackburn et al. | |
| 9,483,066 B2 | 11/2016 | Finley et al. | |
| 9,490,353 B2 | 11/2016 | Van Zyl et al. | |
| 9,496,122 B1 | 11/2016 | Bhutta | |
| 9,520,269 B2 | 12/2016 | Finley et al. | |
| 9,524,854 B2 | 12/2016 | Hoffman et al. | |
| 9,525,412 B2 | 12/2016 | Mavretic | |
| 9,536,713 B2 | 1/2017 | Van Zyl et al. | |
| 9,543,122 B2 | 1/2017 | Bhutta | |
| 9,544,987 B2 | 1/2017 | Mueller et al. | |
| 9,558,917 B2 | 1/2017 | Finley et al. | |
| 9,577,516 B1 | 2/2017 | Van Zyl et al. | |
| 9,584,090 B2 | 2/2017 | Mavretic | |
| 9,578,731 B2 | 3/2017 | Hoffman et al. | |
| 9,591,739 B2 | 3/2017 | Bhutta | |
| 9,589,767 B2 | 4/2017 | Finley et al. | |
| 9,620,340 B2 | 4/2017 | Finley et al. | |
| 9,651,957 B1 | 5/2017 | Finley et al. | |
| 9,660,613 B2 | 5/2017 | Van Zyl et al. | |
| 9,673,028 B2 | 6/2017 | Walde et al. | |
| 9,697,911 B2 | 7/2017 | Bhutta | |
| 9,711,331 B2 | 7/2017 | Mueller et al. | |
| 9,711,335 B2 | 7/2017 | Christie et al. | |
| 9,728,378 B2 | 8/2017 | Bhutta et al. | |
| 9,729,122 B2 | 8/2017 | Mavretic | |
| 9,741,544 B2 | 8/2017 | Van Zyl et al. | |
| 9,745,660 B2 | 8/2017 | Bhutta | |
| 9,748,076 B1 | 8/2017 | Choi et al. | |
| 9,755,641 B1 | 9/2017 | Bhutta | |
| 9,773,644 B2 | 9/2017 | Van Zyl et al. | |
| 9,807,863 B1 | 10/2017 | Van Zyl et al. | |
| 9,812,305 B2 | 11/2017 | Pelleymounter et al. | |
| 9,844,127 B2 | 12/2017 | Bhutta | |
| 9,852,890 B2 | 12/2017 | Mueller et al. | |
| 9,854,659 B2 | 12/2017 | Van Zyl et al. | |
| 9,865,432 B1 | 1/2018 | Bhutta | |
| 9,952,297 B2 | 4/2018 | Wang | |
| 10,008,317 B2 | 6/2018 | Iyer | |
| 10,020,752 B1 | 7/2018 | Vinciarelli | |
| 10,026,592 B2 | 7/2018 | Chen | |
| 10,026,594 B2 | 7/2018 | Bhutta | |
| 10,026,595 B2 | 7/2018 | Choi et al. | |
| 10,074,518 B2 | 9/2018 | Van Zyl et al. | |
| 10,139,285 B2 | 11/2018 | Murray et al. | |
| 10,141,788 B2 | 11/2018 | Kamstedt | |
| 10,194,518 B2 | 1/2019 | Van Zyl et al. | |
| 10,217,618 B2 | 2/2019 | Larson et al. | |
| 10,224,184 B2 | 3/2019 | Van Zyl et al. | |
| 10,224,186 B2 | 3/2019 | Polak et al. | |
| 10,263,577 B2 | 4/2019 | Van Zyl et al. | |
| 10,269,540 B1 | 4/2019 | Carter et al. | |
| 10,314,156 B2 | 6/2019 | Van Zyl et al. | |
| 10,332,730 B2 | 6/2019 | Christie et al. | |
| 10,340,879 B2 | 7/2019 | Mavretic | |
| 10,373,811 B2 | 8/2019 | Christie et al. | |
| 10,374,070 B2 | 8/2019 | Wood | |
| 10,410,836 B2 | 9/2019 | McChesney | |
| 10,411,769 B2 | 9/2019 | Bae | |
| 10,447,174 B1 | 10/2019 | Porter, Jr. et al. | |
| 10,469,108 B2 | 11/2019 | Howald | |
| 10,475,622 B2 | 11/2019 | Pankratz et al. | |
| 2003/0121609 A1 | 7/2003 | Ohmi et al. | |
| 2003/0150710 A1 | 8/2003 | Evans et al. | |
| 2003/0230984 A1 | 12/2003 | Kitamura et al. | |
| 2004/0016402 A1 | 1/2004 | Walther et al. | |
| 2004/0026235 A1 | 2/2004 | Stowell, Jr. | |
| 2005/0034811 A1 | 2/2005 | Mahoney et al. | |
| 2005/0045475 A1 | 3/2005 | Wantanabe | |
| 2005/0270805 A1 | 12/2005 | Yasumura | |
| 2006/0005928 A1 | 1/2006 | Howald | |
| 2006/0169582 A1 | 8/2006 | Brown et al. | |
| 2006/0169584 A1 | 8/2006 | Brown et al. | |

(56) References Cited

U.S. PATENT DOCUMENTS

| | | |
|---|---|---|
| 2006/0249729 A1 | 11/2006 | Mundt et al. |
| 2007/0121267 A1 | 5/2007 | Kotani |
| 2007/0222428 A1 | 9/2007 | Garvin et al. |
| 2008/0061793 A1 | 3/2008 | Anwar et al. |
| 2008/0061901 A1 | 3/2008 | Gilmore |
| 2008/0087381 A1 | 4/2008 | Shannon et al. |
| 2008/0197854 A1 | 8/2008 | Valcore et al. |
| 2008/0272875 A1 | 11/2008 | Huang et al. |
| 2008/0317974 A1 | 12/2008 | de Vries |
| 2009/0026964 A1 | 1/2009 | Knaus |
| 2009/0206974 A1 | 8/2009 | Meinke |
| 2010/0012029 A1 | 1/2010 | Forester et al. |
| 2010/0072172 A1 | 3/2010 | Ui et al. |
| 2010/0096261 A1 | 4/2010 | Hoffman et al. |
| 2010/0098882 A1 | 4/2010 | Lubomirsky et al. |
| 2010/0159120 A1 | 6/2010 | Dzengeleski et al. |
| 2011/0121735 A1 | 5/2011 | Penny |
| 2011/0140607 A1 | 6/2011 | Moore et al. |
| 2011/0148303 A1 | 6/2011 | Van Zyl et al. |
| 2011/0174777 A1 | 7/2011 | Jensen et al. |
| 2012/0097104 A1 | 4/2012 | Pipitone et al. |
| 2012/0097524 A1 | 4/2012 | Pipitone et al. |
| 2012/0145322 A1 | 6/2012 | Gushiken et al. |
| 2012/0164834 A1 | 6/2012 | Jennings et al. |
| 2012/0262064 A1 | 10/2012 | Nagarkatti |
| 2013/0002136 A1 | 1/2013 | Blackburn et al. |
| 2013/0140984 A1 | 6/2013 | Hirayama |
| 2013/0180964 A1 | 7/2013 | Ilic |
| 2013/0214683 A1 | 8/2013 | Valcore et al. |
| 2013/0240482 A1 | 9/2013 | Nam et al. |
| 2013/0278140 A1 | 10/2013 | Mudunuri et al. |
| 2013/0345847 A1 | 12/2013 | Valcore et al. |
| 2014/0225504 A1 | 8/2014 | Kaneko |
| 2014/0239813 A1 | 8/2014 | Van Zyl |
| 2014/0265911 A1 | 9/2014 | Kamata et al. |
| 2014/0328027 A1 | 11/2014 | Zhang et al. |
| 2014/0367043 A1 | 12/2014 | Bishara et al. |
| 2015/0002020 A1 | 1/2015 | Boston |
| 2015/0115797 A1 | 4/2015 | Yuzurihara |
| 2015/0150710 A1 | 6/2015 | Evans et al. |
| 2015/0313000 A1 | 10/2015 | Thomas et al. |
| 2016/0002020 A1 | 1/2016 | Orita |
| 2016/0248396 A1 | 8/2016 | Mavretic |
| 2016/0308560 A1 | 10/2016 | Howald et al. |
| 2017/0018349 A1 | 1/2017 | Otsubo et al. |
| 2017/0133886 A1 | 5/2017 | Kurs et al. |
| 2017/0338081 A1 | 11/2017 | Yamazawa |
| 2017/0345620 A1 | 11/2017 | Coumou et al. |
| 2018/0034446 A1 | 1/2018 | Wood |
| 2018/0102238 A1 | 4/2018 | Gu et al. |
| 2018/0261431 A1 | 9/2018 | Hammond, IV |
| 2019/0172683 A1 | 6/2019 | Mavretic |
| 2019/0199241 A1 | 6/2019 | Satoshi et al. |
| 2019/0385822 A1 | 12/2019 | Marakhtanov et al. |

FOREIGN PATENT DOCUMENTS

| | | | | |
|---|---|---|---|---|
| JP | 2002033240 A | * | 1/2002 | |
| JP | 2006-310245 A | | 6/2008 | |
| JP | 2010-016124 A | | 1/2010 | |
| JP | 2015-502213 A | | 1/2015 | |
| KR | 10-2006-0067957 A | | 6/2006 | |
| KR | 10-2014-0077866 A | | 6/2014 | |
| KR | 10-2017-0127724 A | | 11/2017 | |
| KR | 10-2018-0038596 A | | 4/2018 | |
| WO | WO-2012000532 A1 | * | 1/2012 | ............ H01G 13/00 |
| WO | 2012054305 | | 4/2012 | |
| WO | 2012054306 | | 4/2012 | |
| WO | 2012054307 | | 4/2012 | |
| WO | 2016048449 A1 | | 3/2016 | |
| WO | 2016097730 | | 6/2016 | |
| WO | 2019096564 A1 | | 5/2019 | |
| WO | 2019147513 A1 | | 8/2019 | |
| WO | 2019-244734 A1 | | 12/2019 | |

OTHER PUBLICATIONS

Stowell, et al., "RF-superimposed DC and pulsed DC sputtering for deposition of transparent conductive oxides", Thin Solid Films 515 (2007), pp. 7654-7657.

Bender, et al., "Characterization of a RF=dc-magnetron discharge for the sputter deposition of transparent and highly conductive ITO films", Appl. Phys. A 69, (1999), pp. 397-409.

Economou, Demetre J., "Fundamentals and application of ion-ion plasmas", Applied Surface Science 253 (2007), pp. 6672-6680.

Godyak et al., "Plasma parameter evolution in a periodically pulsed ICP", XXVIIth, Eindhoven, the Netherlands, Jul. 18-22, 2005, 4 pages.

Banna, et al., "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009, pp. 1730-1746.

Kushner, Mark J., "Pulsed Plasmas as a Method to Improve Uniformity During Materials Processing", Journal of Applied Physics, Jul. 1, 2004, vol. 96, No. 1, pp. 82-93.

LTM Technologies, M. Haass "Synchronous Plasma Pulsing for Etch Applications", Apr. 3, 2010 16 pages.

PCT/US2020/038892—International Search Report and Written Opinion of the International Searching Authority, dated Oct. 6, 2020, 3 pages.

PCT/US2020/038899—International Search Report and Written Opinion of the International Searching Authority, dated Sep. 26, 2019, 5 pages.

PCT/US2021/012847—International Search Report and Written Opinion of the International Searching Authority, dated May 6, 2021, 11 pages.

PCT/US2021/012849 International Search Report and Written Opinion of the International Searching Authority, dated May 10, 2021, 11 pages.

PCT/US2021/012851 International Search Report and Written Opinion of the International Searching Authority, dated May 6, 2021, 10 pages.

\* cited by examiner

DIELECTRIC FLUID VARIABLE CAPACITOR

BACKGROUND

Variable capacitors are used in a variety of applications, particularly those involving high frequency, high power signals. Variable capacitors may be utilized, for example, in oscillation circuits for high-power radio transmission, high-frequency power supplies for semiconductor manufacturing equipment, and impedance matching networks in which the impedance of a time-dependent, high-frequency load is to be matched with that of a generator.

A capacitor consists essentially of two spaced-apart capacitor plates with an insulator or dielectric material disposed between the capacitor plates. As used herein, the terms "dielectric," "dielectric material" and "dielectric medium" are interchangeably used to refer to a material (i.e., solid, liquid, or gas) which is polarizable in the presence of an electric field, typically expressed in terms of the material's electrical susceptibility x.

In a vacuum variable capacitor, the two capacitor plates are maintained in a high vacuum, (e.g., $10^{-6}$ Torr or greater) which serves as the capacitor's dielectric, having a susceptibility x≈0. In some vacuum variable capacitors, the capacitor plates may be configured as a plurality of interdigitated, concentric cylindrical coil plates, and the variability of capacitance may be achieved through physically adjusting the length of overlapping in the interdigitation.

BRIEF DESCRIPTION OF THE DRAWINGS

The present disclosure is best understood from the following detailed description when read with the accompanying figures, wherein.

Figure 1:
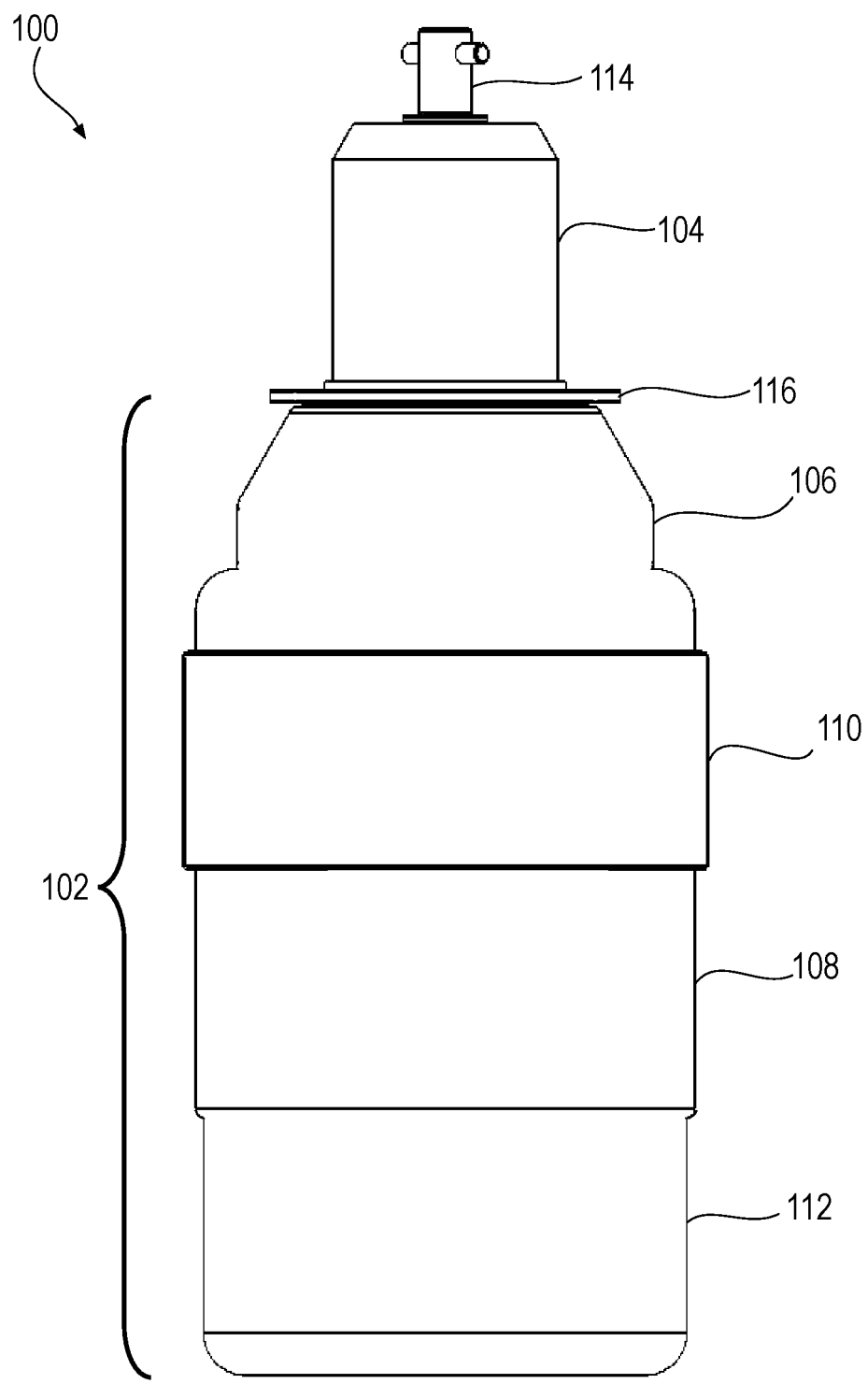
FIG. 1 is a side external view of a liquid dielectric variable capacitor according to one or more examples.

It is emphasized that, in accordance with the standard practice in the industry, various features are not drawn to scale. In fact, the dimensions of the various features may be arbitrarily increased or reduced for clarity of discussion or illustration.

DETAILED DESCRIPTION

Illustrative examples of the subject matter claimed below are disclosed. In the interest of clarity, not all features of an actual implementation are described for every example in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

The expressions such as "include" and "may include" which may be used in the present disclosure denote the presence of the disclosed functions, operations, and constituent elements, and do not limit the presence of one or more additional functions, operations, and constituent elements. In the present disclosure, terms such as "include" and/or "have", may be construed to denote a certain characteristic, number, operation, constituent element, component or a combination thereof, but should not be construed to exclude the existence of or a possibility of the addition of one or more other characteristics, numbers, operations, constituent elements, components or combinations thereof.

As used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

As used herein, to "provide" an item means to have possession of and/or control over the item. This may include, for example, forming (or assembling) some or all of the item from its constituent materials and/or, obtaining possession of and/or control over an already-formed item.

Unless otherwise defined, all terms including technical and/or scientific terms used herein have the same meaning as commonly understood by one of ordinary skill in the art to which the present disclosure pertains. In addition, unless otherwise defined, all terms defined in generally used dictionaries may not be overly interpreted.

The subject matter described herein is directed to examples of variable capacitors incorporating a liquid dielectric material between capacitor plates. The liquid dielectric material may increase the effective maximum capacitance of the variable capacitor for a given capacitor plate geometry. The liquid dielectric material may further increase the electrical breakdown voltage of the capacitor for a given capacitor plate geometry. The liquid dielectric material may further provide for additional dissipation of thermal energy within the variable capacitor relative to, for example, a vacuum capacitor, owing to the potential of a liquid dielectric having a greater thermal conductivity than a vacuum.

FIG. 1 is a side external view of a liquid dielectric variable capacitor 100 according to one or more examples. Liquid dielectric variable capacitor 100 includes an enclosure 102 with an actuator end cap 104 as hereinafter described. In the example of FIG. 1, enclosure 102 includes a first conductive collar 106 and a second conductive collar 108 electrically insulated from one another by an intermediate electrically insulating element 110 joined in a hermetic manner to conductive collars 106 and 108. In examples, conductive collars 106 and 108 may be a metal such as silver-plated copper, copper, brass, aluminum, or brazed aluminum. In examples, intermediate electrically insulating element 110 may be substantially cylindrical, and may be made of ceramic or another suitable insulating material.

Enclosure 102 further includes a lower expansion housing 112 coupled below second conductive collar 108 to enclose a flexible dielectric liquid reservoir structure as hereinafter described. An upper end of an actuator 114 extends out of actuator end cap 104. In some examples, actuator 114 may threaded, and may be rotated to advance and retract a movable capacitor assembly within enclosure 102. In other examples, actuator 114 may be advanced and retracted by means of a linear motor, an electromagnetic coil arrangement, or hydraulic or pneumatic systems. In examples, a conductive mounting plate 116 may be provided in electrical contact with first conductive collar 106 to facilitate physical installation of liquid dielectric variable capacitor 100 in operating environments. Conductive mounting plate 116 may further provide an external electrical connection to liquid dielectric variable capacitor 100 as herein described.

Figure 2:
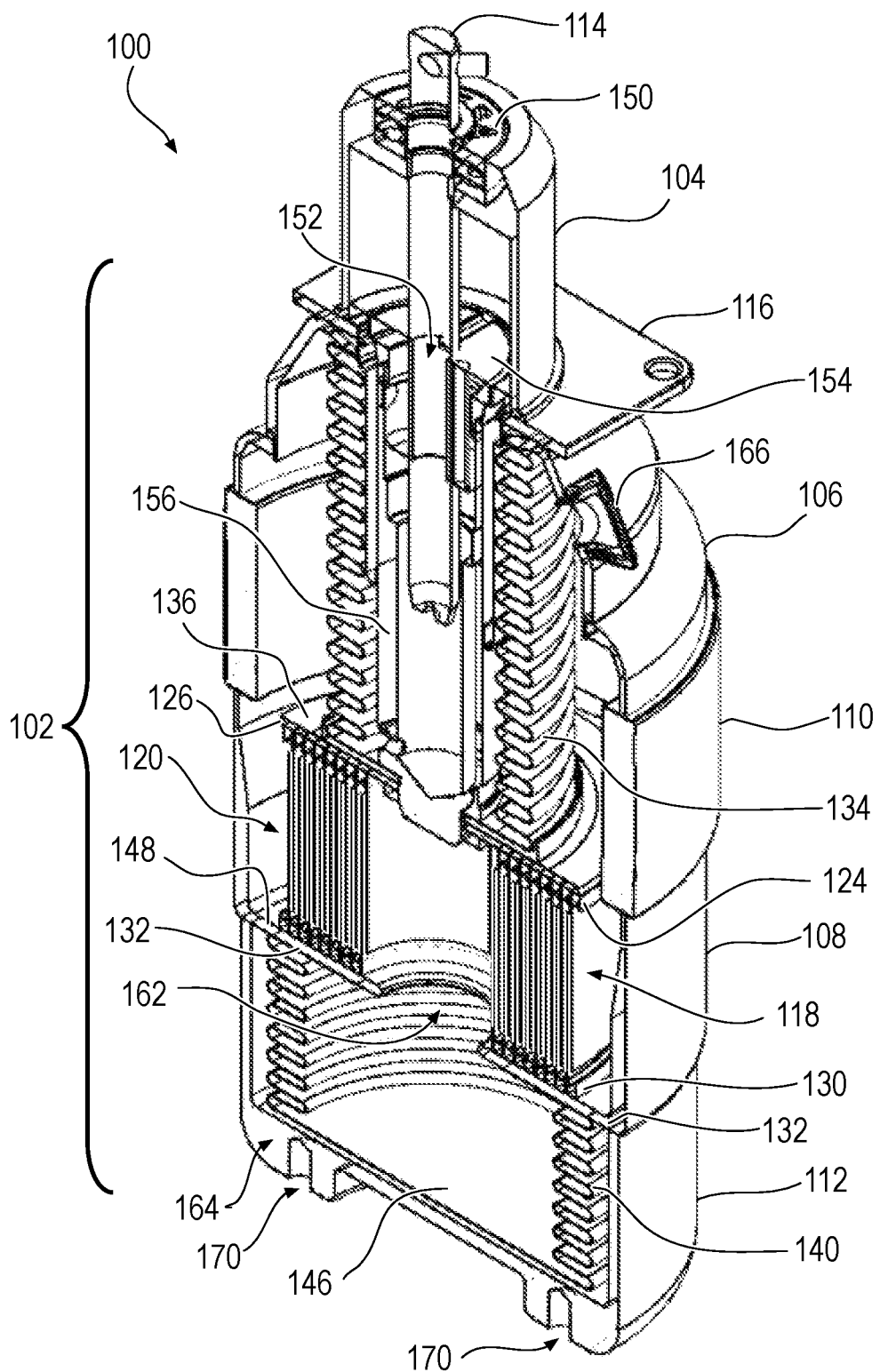
FIG. 2 is a cut-away perspective view of the liquid dielectric variable capacitor of FIG. 1.
Figure 3:
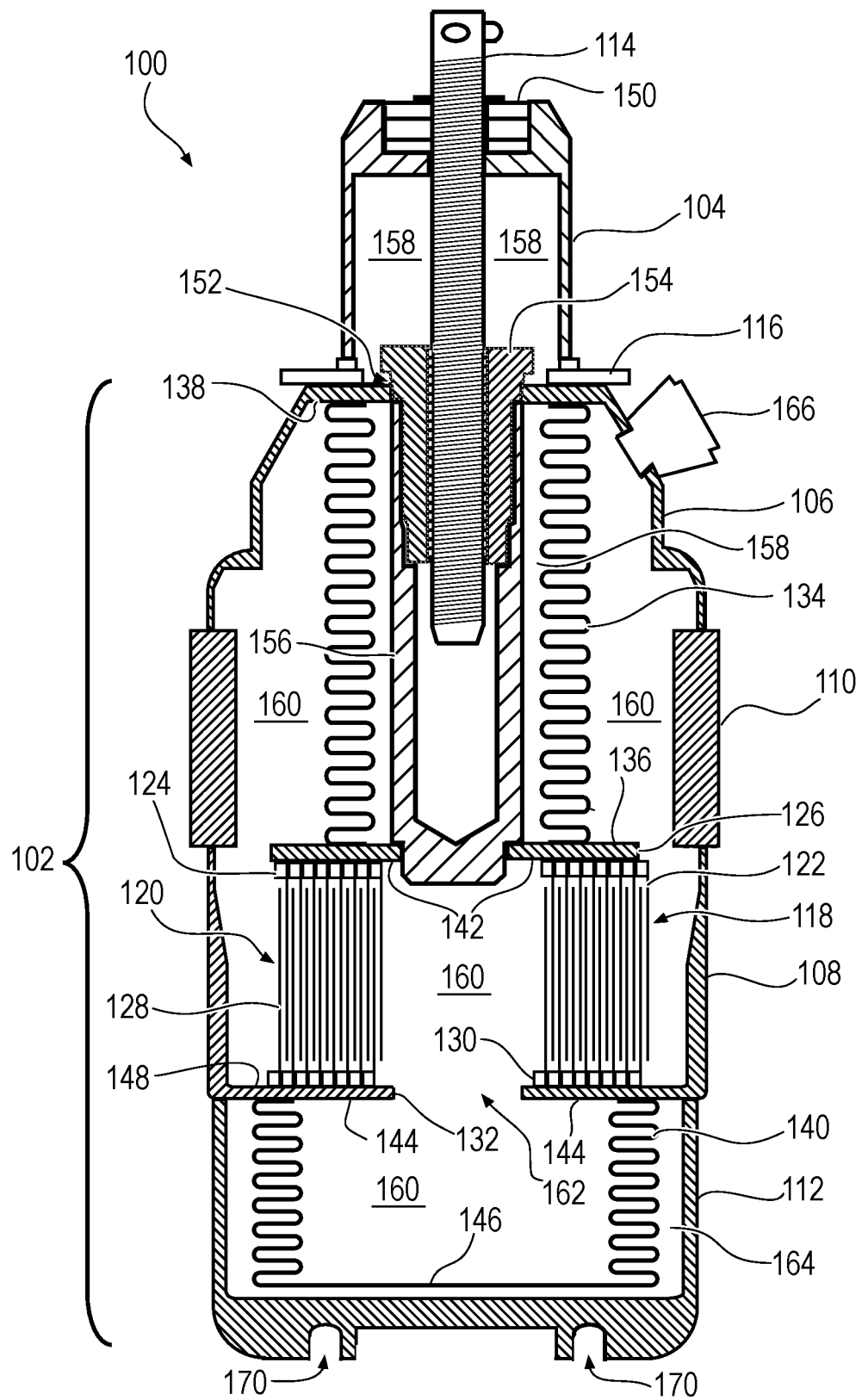
FIG. 3 is a side cross-sectional view of the liquid dielectric capacitor of FIG. 1 with capacitor plates in a first positional relationship.
Figure 4:
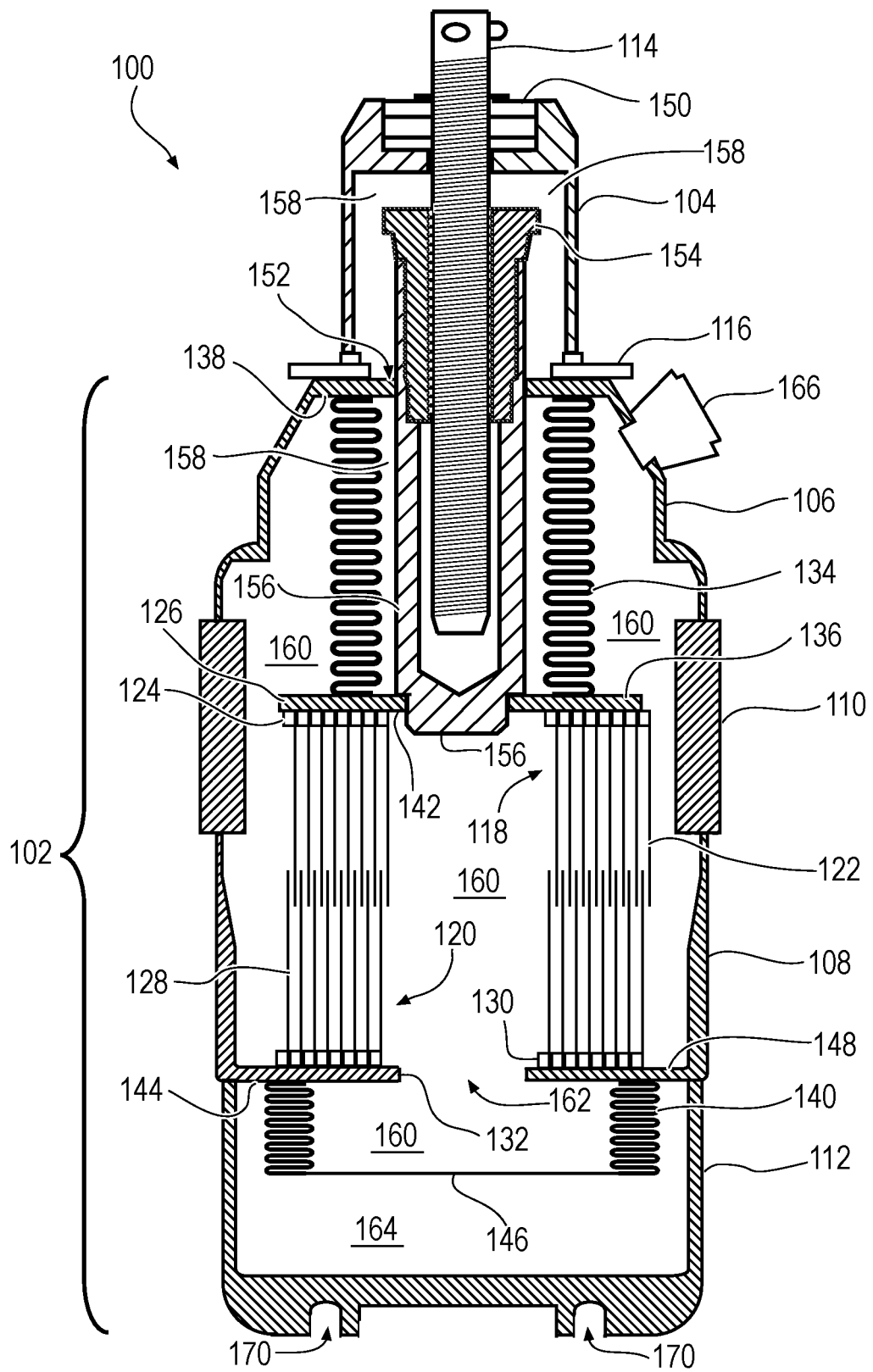
FIG. 4 is a side cross-sectional view of the liquid dielectric variable capacitor of FIG. 1 with capacitor plates in a second positional relationship.

FIG. 2 is a cut-away perspective view of liquid dielectric variable capacitor 100 according to one or more examples. FIGS. 3 and 4 are a front cross-sectional views of liquid dielectric variable capacitor 100. As illustrated in FIGS. 2-4, contained within enclosure 102 are a first capacitor plate assembly 118 and a second capacitor plate assembly 120. First capacitor plate assembly 118 includes a first capacitor plate 122 coupled to a first electrode 124. First electrode 124 of first capacitor plate assembly 118 is coupled to the underside of a first mounting plate 126. Second capacitor plate assembly 120 includes a second capacitor plate 128 coupled to a second electrode 130. Second electrode of second capacitor plate assembly 120 is coupled to a top of a second mounting plate 132.

Figure 5:
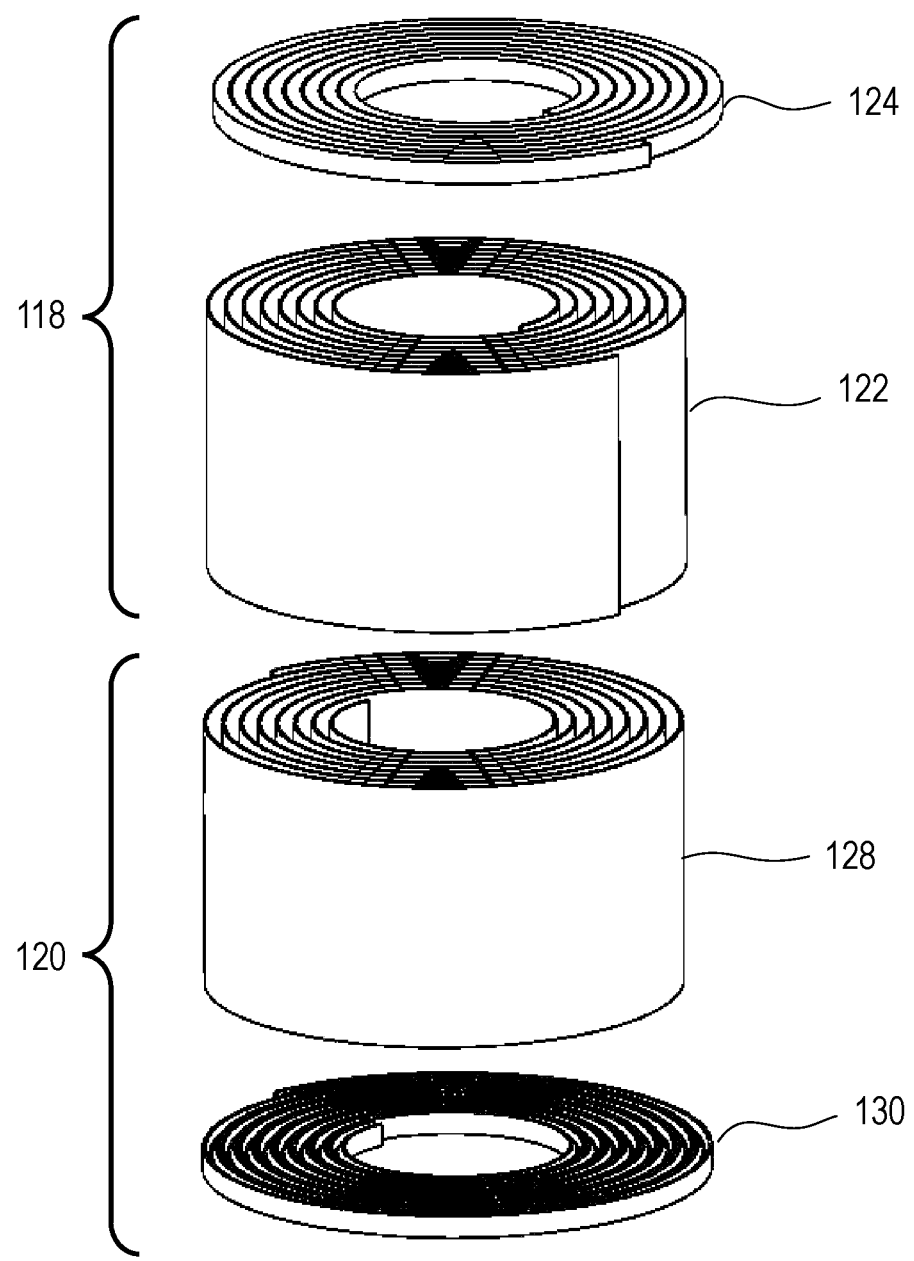
FIG. 5 is an exploded perspective view of stationary and movable capacitor plate assemblies in the example of FIG. 1.

FIG. 5 is an exploded perspective view of first capacitor plate assembly 118 and second capacitor plate assembly 120 according to one or more examples. As shown in FIG. 5, first capacitor plate 122 and second capacitor plate 128 comprise wound, concentric cylindrical coil capacitor plates, with first capacitor plate 122 being electrically attached at a top end to first electrode 124 configured as a cylindrical coil and second capacitor plate 128 attached at bottom end to second electrode 130 configured as a cylindrical coil.

In examples, first and second capacitor plate assemblies 118 and 120 are configured such that first and second mounting plates 126 and 132 may be positioned relative to each other to enable first capacitor plate 122 to concentrically interdigitate with second capacitor plate 128. In examples, first capacitor plate 122 and second capacitor plate 128 do not contact each other directly, although the spacing between first mounting plate 126 and second mounting plate 132 may be adjusted, as described herein, to vary the length of concentric, overlapping interdigitation between first capacitor plate 122 and second capacitor plate 128, thereby adjusting the effective capacitance established between first capacitor plate 122 and second capacitor plate 128. In examples, first and second capacitor plates 122 and 128 may be made of materials (e.g., oxygen-free copper or copper-plated brass) conventionally used for such structures in a vacuum variable capacitor.

With continued reference to FIGS. 2-4, and especially with references to FIGS. 3-4, in one or more examples a flexible structure 134 is in sealed attachment between a top surface 136 of first mounting plate 126 and an inner top portion 138 of first collar 106. First electrode 124 is mechanically and electrically coupled to a bottom surface 142 of first mounting plate 126.

A flexible dielectric liquid reservoir structure 140 is in in sealed attachment to a bottom surface 144 of second mounting plate 132 and has a closed bottom end 146. Second electrode 130 is mechanically and electrically coupled to a top surface 148 of second mounting plate 132.

In examples herein, flexible structure 134 and flexible dielectric liquid reservoir structure 140 are implemented as flexible bellows capable of expanding or compressing in length and thereby changing their respective internal volumes. It is contemplated that other flexible structures may be implemented to achieve the functionality of flexible structure 134 and flexible dielectric liquid reservoir structure 140 described herein.

As shown in FIGS. 2-4, actuator 114 extends through one or more gaskets 150 in actuator end cap 104 and through an aperture 152 in first collar 106, extending partially into flexible structure 134. In one or more examples, actuator 114 threadably engages a thrust assembly comprising a thrust collar 154 and an extended coupling 156 secured to first mounting plate 126.

With continued reference to FIGS. 2-4, a plurality of separate volumes are defined within enclosure 102. In particular, with reference especially to FIGS. 3 and 4, a first volume 158 is defined within actuator end cap 104 and within the interior of flexible structure 134. (Multiple reference numerals 158 appear in FIGS. 3 and 4 to indicate the extent of first volume 158).

A second volume 160 is defined within enclosure 102. (Again, multiple reference numerals 160 appear in FIGS. 3 and 4 to indicate the extent of second volume 160). As shown in FIGS. 3 and 4. Second volume 160 is defined outside of flexible structure 134, within intermediate electrically insulating element 110, within second collar 108, between first and second capacitor plates 122 and 128, and within the interior of second flexible structure 140. In examples, second volume 160 extends into second flexible structure 140 due the existence of an aperture 162 in second mounting plate 132. A third volume 164 may be defined between the exterior of second flexible structure 140 and the interior of lower expansion housing 112.

In examples, first volume 158 may be at or near external, atmospheric pressure, due to a possibly nominal seal between actuator 114 and gaskets 150 as actuator enters actuator end cap 104. On the other hand, second volume 160 is hermetically (i.e., vacuum- and liquid-tight) sealed, due to sealed attachment of flexible structure 134 to first collar 106 and to first mounting plate 126, such as by brazing, as well as by secured attachment of second flexible structure 140 to second mounting plate 132, again, such as by brazing. Third volume 164 may be at or near atmospheric pressure or at a vacuum, depending upon construction techniques.

In accordance with one or more examples, second volume 160 may be filled with a dielectric liquid, serving as the dielectric material between first capacitor plate 122 and second capacitor plate 128. In examples, a pinch port 166 may be provided for introduction of dielectric fluid into second volume 160, after which pinch port 166 may be pinched closed to hermetically seal second volume 160. In examples, the dielectric fluid may be a fluid with a high dielectric breakdown characteristic, i.e., a fluid having a dielectric constant greater than or equal to one (1.0), such as fluids used in high-voltage transformers and the like. In one example, the dielectric fluid may be Xiameter™ PMX-200 Silicone Fluid, commercially available from Dow Chemical Company. Also, in examples, the dielectric fluid provides thermal conductivity properties superior to other dielectric materials, such as the vacuum of vacuum capacitors.

According to the present examples, the extent of interdigitated overlapping of first capacitor plate 122 and second capacitor plate 128 may be adjusted through rotation of actuator 114. Rotation of actuator 114, such as by a stepper motor or servo-motor (not shown) causes threads of actuator 114 to raise or lower thrust collar 154 and extended coupling 156, thereby raising or lowering first mounting plate 126 relative to second mounting plate 132. That is, in these examples, first mounting plate 126, carrying first capacitor plate assembly 118, is movable with respect to second mounting plate 132, carrying second capacitor plate assembly 120.

With reference specifically to FIGS. 3 and 4, FIG. 3 shows liquid dielectric variable capacitor in a first operational configuration, in which thrust collar 154 and extended coupling 156 are advanced to a maximum extent into enclosure 102, such that the interdigitated overlap between first capacitor plate 122 and second capacitor plate 128 is at a maximum. This maximizes the capacitance between first capacitor plate 122 and second capacitor plate 128, due to the interdigitated overlap being at a maximum.

In examples, first mounting plate 126, flexible structure 134, extended coupling 156, thrust collar 154, and mounting plate 116 are conductive (e.g., metallic) and provide a low-resistance electrical conduction path between first electrode 124, first collar 106, and mounting plate 116, which may serve as a first external electrical contact for liquid dielectric variable capacitor 100. Second electrode 130 is coupled to second mounting plate, which may be integral with (or electrically coupled to) second collar, thereby enabling second collar to serve as a second electrical connection to liquid dielectric variable capacitor 100. In examples, an electrode plate (not shown) may be attached to a bottom of second collar 108 to serve as an electrode of liquid dielectric variable capacitor 100. To facilitate attachment of an electrode plate, threaded sockets 170 may be provided in second collar 108.

In examples, when actuator 114 is rotated in a first direction to advance thrust collar 154, extended coupling 156, and first mounting plate 126 toward second mounting plate 132, this advancement effectively reduces the volume of second volume 160. To accommodate this reduction in volume, second flexible structure 140 may expand (as shown in FIG. 3) to serve as a reservoir for displaced liquid dielectric. On the other, actuator 114 may alternatively be rotated in a second, opposite direction to retract thrust collar 154, extended coupling 156, and first mounting plate 126 away from second mounting plate 132, this retraction effectively increases the volume of second volume 160, causing second flexible structure 140 to contract, such that liquid dielectric that is present in second flexible structure 140 may be maintained throughout volume 160.

One or more liquid dielectric variable capacitors such as liquid dielectric variable capacitor 100 from the example of FIGS. 1-5 herein may be utilized for tuning and otherwise controlling matching networks in radio frequency plasma processing devices. Radio frequency (RF) plasma-enhanced processing is extensively used in semiconductor manufacturing to etch different types of films, deposit thin films at low to intermediate processing temperatures, and perform surface treatment and cleaning. One characteristic of such processes is the employment of a plasma, i.e., a partially ionized gas, that is used to generate neutral species and ions from precursors inside a reaction chamber, provide energy for ion bombardment, and/or perform other actions. Radio frequency plasma-enhanced processing is performed by what are known as radio frequency processing devices.

Radio frequency processing devices may include a radio frequency generator that transmits a signal to a plasma reaction chamber. A radio frequency matching device, which may have a variable impedance, may be located between the radio frequency generator and the plasma reaction chamber. The radio frequency matching device may be controlled, or otherwise tuned by varying the impedance of the radio frequency matching device. Tuning the radio frequency matching device reduces reflected power from the plasma reaction chamber and/or the radio frequency matching device, which may increase power that is transferred from the radio frequency generator to the plasma reaction chamber and into the plasma process. During operation, a radio frequency generator may be energized to form a plasma within a reaction chamber. The plasma may be produced after a source gas is injected into the reaction chamber and power is supplied within the reaction chamber by the radio frequency generator.

Under certain conditions, the power that is supplied to the reaction chamber may be reflected back from the reaction chamber. One cause of the reflected power may be a mismatch in the characteristic impedance of the system and the load formed by the plasma within the reaction chamber. To help prevent reflected power, a matching network may be disposed between the radio frequency generator and the reaction chamber. Such matching networks may include a number of variable capacitors or other impedance elements. The variable capacitors may be tuned so that the complex load impedance within the reaction chamber matches the impedance of the radio frequency generator.

While multiple methods of controlling or otherwise tuning matching networks have been used, such methods may not reliably and efficiently result in impedance matching. Matching networks may include stepper motors, which have a specific number of steps that are a function unique to a particular stepper motor. During operation, a capacitor may be driven by a motor that has a range between zero and one hundred percent and the motor may, as a result, have a number of clicks. Embodiments of the present disclosure may provide recipes and/or otherwise allow for the adjustment of a capacitor position based, at least in part, on "a steps to percent ratio."

Figure 6:
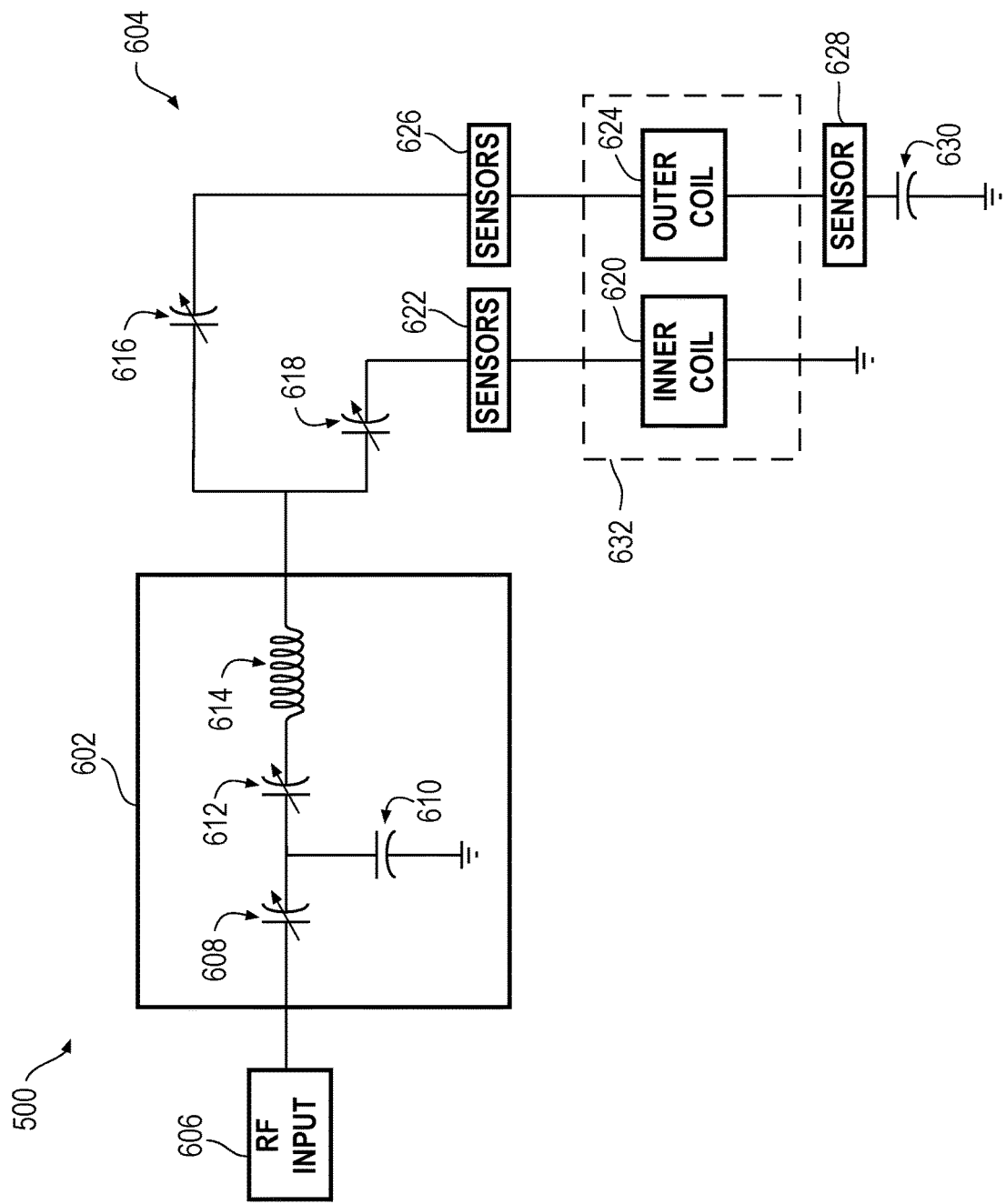
FIG. 6 is a schematic representation of a matching network including liquid dielectric variable capacitors according to one or more examples.

Turning to FIG. 6, a schematic representation of a matching network including liquid dielectric variable capacitors according to one or more examples is shown. In example of FIG. 6, a matching network 600 is illustrated having a matching branch 602 and a splitter branch 604. Matching branch 602 receives radio frequency power from a radiofrequency (RF) input 606. A first variable capacitor 608 of the matching branch 602 receives RF power from RF input 606. First variable capacitor 608 may be a liquid dielectric variable capacitor such as that disclosed herein with reference to FIGS. 1-5, and may be rated at approximately 10-2000 pF.

In the example of FIG. 6, first variable capacitor 608 is connected to a second capacitor 610, which is connected to ground. Second capacitor 610 is also connected to a third variable capacitor 612. Third variable capacitor 612 may also be a liquid dielectric variable capacitor such as that disclosed herein with reference to FIGS. 1-5 and may be rated at approximately 10-2000 pF. Third variable capacitor 612 is also connected to an inductor 614, which further connects to splitter branch 604.

Splitter branch 604 receives RF power from matching branch 602, which, splits the received RF power between a fourth variable capacitor 616 and a fifth variable capacitor 618. Fourth variable capacitor 616 and fifth variable capacitor 618 may also be liquid dielectric variable capacitors such as that disclosed herein with reference to FIGS. 1-5 and may be rated at approximately 10-2000 pF.

Fifth variable capacitor 618 is connected to an inner coil 620. Between fifth variable capacitor 618 and inner coil 620, one or more sensors 622 may be disposed. Sensor(s) 622 may be used to measure, for example, voltage between fifth variable capacitor 618 and ground. Similarly, fourth variable capacitor 616 is connected to an outer coil 624. Between fourth variable capacitor 616 and outer coil 624, one or more sensors 626 may be disposed. Sensors 626 may be used to measure, for example, voltage between fourth variable capacitor 616 and ground.

Inner coil 620 may further be connected to a ground and outer coil 624 may be connected to circuitry that includes a sensor 628 and a sixth capacitor 630. Sensor 628 may be used to measure, for example, voltage between outer coil 624 and ground. Inner coil 620 and outer coil 624 may be located outside of the matching network 600 circuitry, as indicated by dashed line 632 in FIG. 6.

The circuitry illustrated in FIG. 6 may be used to tune first variable capacitor 608, third variable capacitor 612, fourth variable capacitor 616, and fifth variable capacitor 618. By tuning first variable capacitor 608, third variable capacitor 612, fourth variable capacitor 616, and fifth variable capacitor 618, the power provided to inner coil 620 and outer coil 624 may be adjusted.

The circuitry, which in one embodiment may be employed in matching network 200 as a current split ratio matching network, may be controlled using a programmable logic controller (not shown), which may be disposed in or otherwise connected to matching network 600.

Referring again to FIGS. 2-5, and in particular to FIG. 5, the example shown therein incorporates a first capacitor plate 122 and second capacitor plate 128 each comprising wound, concentric cylindrical coil capacitor plates, with first capacitor plate 122 being electrically attached at a top end to first electrode 124 configured as a cylindrical coil and second capacitor plate 128 attached at bottom end to second electrode 130 configured as a cylindrical coil. It is contemplated, however, that other examples may incorporate capacitor structures having differing geometries.

Figure 7:
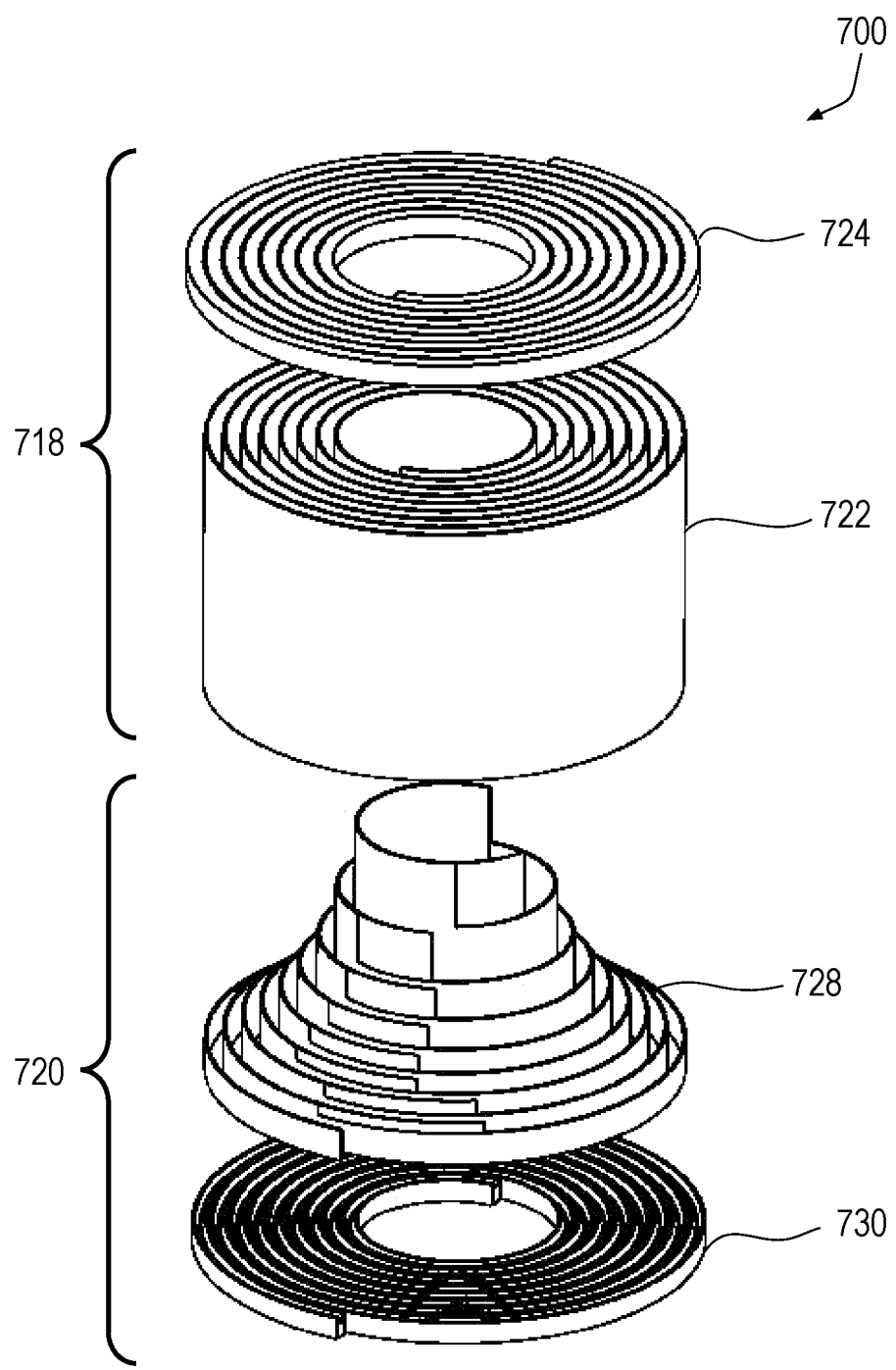
FIG. 7 is an exploded perspective view of stationary and movable capacitor plate assemblies in the example of FIG. 1.

FIG. 7, for example, is an exploded perspective view of a capacitor assembly 700 according to one or more alternative examples. The example of FIG. 7 includes a first capacitor plate assembly 718 and a second capacitor plate assembly. First capacitor plate assembly 718 includes a wound, concentric cylindrical coil capacitor plate 722 and a first electrode 724. Second capacitor plate assembly 720 includes a wound concentric spiral capacitor plate 728 and a second electrode 730. Like the capacitor plate assemblies 118 and 120 from the example of FIGS. 1-5, capacitor plate assemblies 718 and 720 from the example of FIG. 7 are moveable with respect to one another (e.g., capacitor plate assembly 718 may be movable with respect to capacitor plate assembly 720, in order to provide variable capacitance.

As shown in FIG. 7, the height of capacitor plate 728 varies as a function of radius. This may enable the capacitance-versus-position curve achieved through moving capacitor plate assembly 718 relative to capacitor plate assembly 720 to deviate from a linear function and begin to approximate a power function. This in turn may change the impedance-versus-position curve achieved by assembly 700 from a power function to a linear function. In other examples, not shown, a capacitor assembly may have a sinusoidal cross-section.

The foregoing description, for purposes of explanation, uses specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. Examples herein are not intended to be exhaustive of or to limit this disclosure to the precise forms described. Many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A variable capacitor, comprising:
an enclosure having an interior;
a movable capacitor plate assembly disposed in the interior of the enclosure, the movable capacitor plate assembly including a first capacitor plate, a first electrode, and a first mounting plate;
a first flexible structure having a first end sealed around an opening into the interior of the enclosure and a second end sealed to a rear side of the first mounting plate;
a fixed capacitor plate assembly disposed proximal to the first capacitor plate assembly, the fixed capacitor plate assembly including a second capacitor plate, a second electrode, and a second mounting plate;
an actuator coupling assembly coupled to the rear side of the first mounting plate;
an actuator having a longitudinal axis, extending into the opening and through the first flexible structure, a distal end of the actuator engaging with the actuator coupling assembly, the actuator for advancing and retracting the movable capacitor plate assembly with respect to the fixed capacitor plate assembly;
a second flexible structure, disposed on a rear side of the second mounting plate and sealed around an aperture in the second mounting plate;
a dielectric liquid sealed within a volume of the enclosure outside of the first flexible structure and within the second flexible structure, the dielectric liquid serving as a dielectric between the first capacitor plate and the second capacitor plate;
wherein advancement of the movable capacitor plate assembly toward the fixed capacitor plate assembly displaces a volume of the dielectric liquid through the aperture in the second mounting plate into the second flexible structure and expanding the second flexible structure;
and wherein retraction of the moveable capacitor plate assembly away from the fixed capacitor plate assembly draws a volume of the dielectric liquid out of the second flexible structure and contracting the second flexible structure.

2. The variable capacitor of claim 1, wherein the actuator includes threads for engaging the actuator coupling assembly, such that such that rotation of the actuator in a first direction advances the movable capacitor plate assembly toward the fixed capacitor plate assembly and expanding the first flexible structure, and rotation of the threaded actuator in a second direction retracts the movable capacitor plate assembly away from the fixed capacitor plate assembly and contracting the first flexible structure.

3. The variable capacitor of claim 1, wherein the first and second flexible structures comprise bellows structures.

4. The variable capacitor of claim 3, wherein enclosure includes a first conductive collar in electrical contact with the movable capacitor plate assembly, a second conductive collar in electrical contact with the fixed capacitor plate assembly, and an intermediate electrically insulating element separating the first conductive collar and the second conductive collar.

5. The variable capacitor of claim 4, wherein the first flexible structure provides a conductive connection between the movable capacitor plate assembly and the first conductive collar.

6. The variable capacitor of claim 1, wherein the first and second capacitor plates each comprise a wound cylindrical coil, the first and second capacitor plates being interdigitated.

7. The variable capacitor of claim 6, wherein the advancing and retracting of the movable capacitor assembly varies the extent of overlapping interdigitation of the first and second capacitor plates, thereby varying the capacitance of the variable capacitor.

8. The variable capacitor of claim 1, wherein the first capacitor plate comprises a wound cylindrical coil, the second capacitor plate comprises a wound spiral coil, the first and second capacitor plates being interdigitated.

9. A method of adjusting capacitance of a variable capacitor, comprising:
  providing an enclosure having an interior;
  providing a movable capacitor plate assembly disposed in the interior of the enclosure, the movable capacitor plate assembly including a first capacitor plate, a first electrode, and a first mounting plate;
  providing a first flexible structure having a first end sealed around an opening into the interior of the enclosure and a second end sealed to a rear side of the first mounting plate;
  providing a fixed capacitor plate assembly disposed proximal to the first capacitor plate assembly, the fixed capacitor plate assembly including a second capacitor plate, a second electrode, and a second mounting plate;
  providing an actuator coupling assembly coupled to the rear side of the first mounting plate;
  providing an actuator having a longitudinal axis, extending into the opening and through the first flexible structure, a distal end of the actuator engaging with the actuator coupling assembly, the actuator for advancing and retracting the movable capacitor plate assembly with respect to the fixed capacitor plate assembly;
  providing a second flexible structure, disposed on a rear side of the second mounting plate and sealed around an aperture in the second mounting plate;
  providing a dielectric liquid sealed within a volume of the enclosure outside of the first flexible structure and within the second flexible structure, the dielectric liquid serving as a dielectric between the first capacitor plate and the second capacitor plate;
  advancing the movable capacitor plate assembly toward the fixed capacitor plate assembly to increase capacitance of the variable capacitor, wherein the advancing of the movable capacitor plate assembly displace a volume of the dielectric liquid through the aperture in the second mounting plate into the second flexible structure and expanding the second flexible structure;
  retracting the moveable capacitor plate assembly away from the fixed capacitor plate assembly to decrease capacitance of the variable capacitor, wherein the retracting of the movable capacitor plate assembly draws a volume of the dielectric liquid out of the second flexible structure and contracting the second flexible structure.

10. The method of claim 9, wherein the actuator includes threads for engaging the actuator coupling assembly, such that such that rotation of the actuator in a first direction advances the movable capacitor plate assembly toward the fixed capacitor plate assembly and expanding the first flexible structure, and rotation of the threaded actuator in a second direction retracts the movable capacitor plate assembly away from the fixed capacitor plate assembly and contracting the first flexible structure.

11. The method of claim 9, wherein the first and second flexible structures comprise bellows structures.

12. The method of claim 11, wherein enclosure includes a first conductive collar in electrical contact with the movable capacitor plate assembly, a second conductive collar in electrical contact with the fixed capacitor plate assembly, and an intermediate electrically insulating element separating the first conductive collar and the second conductive collar.

13. The method of claim 9, wherein the first and second capacitor plates each comprise a cylindrical coil, the first and second capacitor plates being interdigitated.

14. The method of claim 13, wherein the advancing and retracting of the movable capacitor assembly varies the extent of overlapping interdigitation of the first and second capacitor plates, thereby varying the capacitance of the variable capacitor.

15. The method of claim 14, wherein the first flexible structure provides a conductive connection between the movable capacitor plate assembly and the first conductive collar.

16. The variable capacitor of claim 9, wherein the first capacitor plate comprises a wound cylindrical coil, the second capacitor plate comprises a wound spiral coil, the first and second capacitor plates being interdigitated.

* * * * *